US011581376B2

(12) United States Patent
Bang et al.

(10) Patent No.: US 11,581,376 B2
(45) Date of Patent: Feb. 14, 2023

(54) METHOD OF MANUFACTURING DISPLAY APPARATUS

(71) Applicant: SAMSUNG DISPLAY CO., LTD., Yongin-si (KR)

(72) Inventors: Kiho Bang, Yongin-si (KR); Wonsuk Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 227 days.

(21) Appl. No.: 17/003,008

(22) Filed: Aug. 26, 2020

(65) Prior Publication Data

US 2021/0273029 A1 Sep. 2, 2021

(30) Foreign Application Priority Data

Feb. 27, 2020 (KR) .................. 10-2020-0024472

(51) Int. Cl.
*H01L 51/56* (2006.01)
*H01L 51/52* (2006.01)
*H01L 27/32* (2006.01)

(52) U.S. Cl.
CPC ...... *H01L 27/3246* (2013.01); *H01L 27/3276* (2013.01); *H01L 51/5253* (2013.01); *H01L 51/56* (2013.01); *H01L 2227/323* (2013.01); *H01L 2251/306* (2013.01); *H01L 2251/308* (2013.01)

(58) Field of Classification Search
CPC ................ H01L 27/3246; H01L 51/5253
See application file for complete search history.

(56) References Cited

U.S. PATENT DOCUMENTS

| 9,905,630 | B2 | 2/2018 | Lee et al. |
| 9,972,693 | B2 | 5/2018 | Kim et al. |
| 10,134,829 | B2 | 11/2018 | Shin et al. |
| 2017/0012242 | A1 | 1/2017 | Choi et al. |
| 2020/0235333 | A1* | 7/2020 | Sung .................. H01L 51/5253 |

FOREIGN PATENT DOCUMENTS

| KR | 1020160147195 A | 12/2016 |
| KR | 1020170006344 A | 1/2017 |
| KR | 1020180001717 A | 1/2018 |
| KR | 1020180058265 A | 6/2018 |

* cited by examiner

*Primary Examiner* — Fernando L Toledo
*Assistant Examiner* — Valerie N Newton
(74) *Attorney, Agent, or Firm* — Cantor Colburn LLP

(57) ABSTRACT

A method of manufacturing a display apparatus includes forming a thin-film transistor on a substrate and forming a planarization layer to cover the thin-film transistor, forming, on the planarization layer, a pixel electrode electrically connected to the thin-film transistor and a pixel defining layer exposing at least a center portion of the pixel electrode, and defining at least one groove having a closed curve shape at a location corresponding to a second non-display area. When the thin-film transistor is formed, a voltage line is also formed at a location corresponding to a first non-display area. When the at least one groove is formed, a portion of the planarization layer disposed between the pad area and the display area is simultaneously removed such that a portion of the voltage line between the pad area and the display area is exposed.

14 Claims, 12 Drawing Sheets

METHOD OF MANUFACTURING DISPLAY APPARATUS

This application claims priority to Korean Patent Application No. 10-2020-0024472, filed on Feb. 27, 2020, and all the benefits accruing therefrom under 35 U.S.C. § 119, the content of which in its entirety is herein incorporated by reference.

BACKGROUND

1. Field

One or more embodiments relate to a method of manufacturing a display apparatus.

2. Description of the Related Art

With the rapid development of display technology for visually expressing electrical signal information, various display apparatuses having excellent characteristics such as a slim profile, a low weight, and low power consumption have been developed. Recently, in order to expand a display area on which an image is displayed, a display apparatus in which a physical button or the like is removed from the front surface of the display apparatus and electronic elements such as a camera and a sensor are arranged within the display area has been introduced.

Since organic light-emitting display apparatuses as self-emitting display apparatuses do not require an additional light source, they can be driven with a low voltage and manufactured to be lightweight and thin. Also, the organic light-emitting display apparatuses have favorable characteristics such as a wide viewing angle, a high contrast, and a fast response speed. However, organic light-emitting diodes may degrade due to moisture, oxygen, or the like, and thus infiltration of external moisture, oxygen, or the like into the organic light-emitting diodes needs to be prevented.

SUMMARY

One or more embodiments include a method of manufacturing a display apparatus, whereby permeation of external moisture, oxygen, or the like into the display apparatus may be effectively prevented.

Additional aspects will be set forth in part in the description which follows and, in part, will be apparent from the description, or may be learned by practice of the presented embodiments of the disclosure According to one or more embodiments, a method of manufacturing a display apparatus including a display area, a first non-display area located around the display area and including a pad area on one side of the first non-display area, and a second non-display area at least partially surrounded by the display area includes forming a thin-film transistor on a substrate at a location corresponding to the display area, and forming a planarization layer to cover the thin-film transistor; forming, on the planarization layer, a pixel electrode electrically connected to the thin-film transistor and a pixel defining layer exposing at least a center portion of the pixel electrode; and defining, at a location corresponding to the second non-display area, at least one groove extending from a surface of the substrate in a thickness direction of the substrate, the at least one groove having a closed curve shape. When the thin-film transistor is formed, a voltage line for applying a voltage to the display apparatus is formed together with the thin-film transistor at a location corresponding to the first non-display area. When the at least one groove is formed, a portion of the planarization layer disposed between the pad area and the display area is simultaneously removed such that a portion of the voltage line between the pad area and the display area is exposed.

The substrate may have a multi-layered structure in which a first base layer, a first barrier layer, a second base layer, and a second barrier layer are sequentially stacked, and the at least one groove may be defined to extend from the second barrier layer to at least a portion of the second base layer in the thickness direction of the substrate.

Before the forming of the at least one groove, a cover layer may be formed on the entire substrate, the cover layer may be patterned to define openings in the cover layer at a location where the at least one groove to be defined and a location between the pad area and the display area, and forming the at least one groove and removing a portion of the planarization layer disposed between the pad area and the display area may be performed via openings.

The at least one groove may be formed and the portion of the planarization layer disposed between the pad area and the display area may be removed by performing dry etching using the cover layer as a mask.

The cover layer may include at least one of tin indium oxide, zinc indium oxide, tin zinc indium oxide, gallium zinc oxide, and gallium zinc indium oxide.

When the portion of the planarization layer disposed between the pad area and the display area is removed, a first dam and a bank which surround the display area may be formed, and the voltage line may be exposed in an adhesion area between the first dam and the bank.

The method may further include forming an intermediate layer including an emission layer on the pixel electrode and an opposite electrode on the intermediate layer; sequentially forming a first inorganic encapsulation layer, an organic encapsulation layer, and a second inorganic encapsulation layer on the opposite electrode; and defining a through hole within an area defined by the at least one groove.

The first inorganic encapsulation layer may directly contact the voltage line and the second inorganic encapsulation layer in the adhesion area.

The at least one groove may include a first groove which surrounds the through hole, and a second groove which is located between the first groove and the through hole and surrounds the through hole, the organic encapsulation layer may fill the first groove, and the first inorganic encapsulation layer and the second inorganic encapsulation layer may directly contact each other within the second groove.

The emission layer may be disconnected by the at least one groove and may be discontinuously formed.

The thin-film transistor may include a semiconductor layer, a gate electrode, a source electrode, and a drain electrode. A first inorganic insulating layer may be formed between the semiconductor layer and the gate electrode to correspond to the entire substrate, and a second inorganic insulating layer may be formed between the gate electrode and the source and drain electrode to correspond to the entire substrate. In the adhesion area, the first inorganic encapsulation layer may directly contact the second inorganic insulating layer.

The pixel defining layer may be formed on the planarization layer and disposed between the pad area and the display area, and, when the at least one groove is formed, the pixel defining layer and the planarization layer may be removed from the adhesion area.

The voltage line may include a first voltage line and a second voltage line which apply different voltages from each other. The first voltage line may include a first main voltage line formed between the display area and the pad area to correspond to a first edge of the display area, and a first connection unit extending from the first main voltage line to the pad area. The second voltage line may include a second main voltage line which surrounds the remaining edge of the display area other than the first edge, and a second connection unit extending from the second main voltage line to the pad area. Respective portions of the first connection unit and the second connection unit which are between the pad area and the display area may be exposed.

The voltage line may be a three-layered layer including a first metal layer, a second metal layer, and a third metal layer, and an etch rate of the second metal layer may be greater than an etch rate of each of the first metal layer and the third metal layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
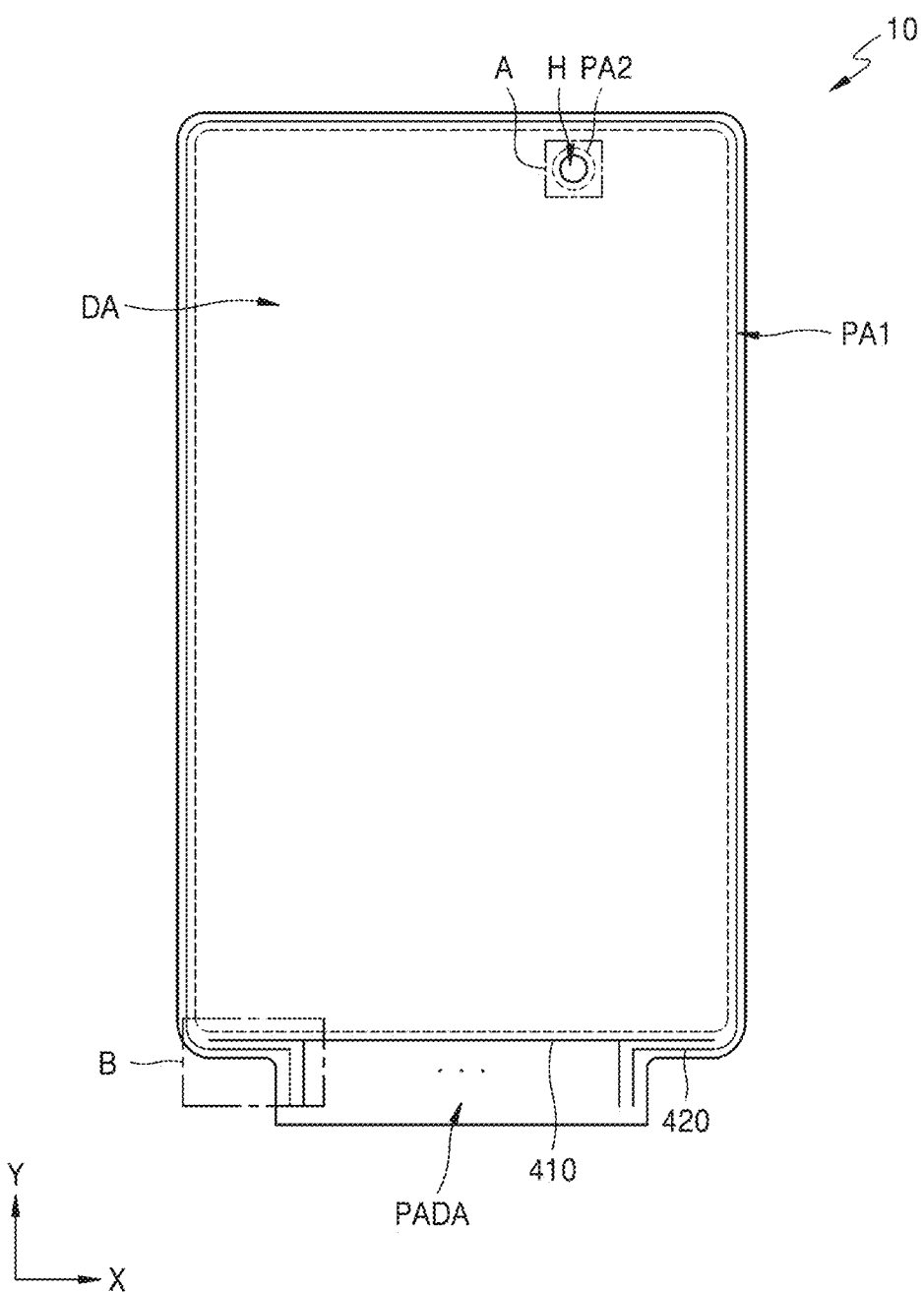
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

One or more embodiments of the disclosure will be described below in more detail with reference to the accompanying drawings. Those components that are the same or are in correspondence are rendered the same reference numeral regardless of the figure number, and redundant explanations are omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments according to the invention are not limited thereto.

When a certain embodiment may be implemented differently, a specific process order may be performed differently from the described order. For example, two consecutively described processes may be performed substantially at the same time or performed in an order opposite to the described order.

It will also be understood that when a layer, region, or component is referred to as being "connected" or "coupled" to another layer, region, or component, it can be directly connected or coupled to the other layer, region, or component or intervening layers, regions, or components may be present. For example, when a layer, region, or component is referred to as being "electrically connected" or "electrically coupled" to another layer, region, or component, it can be directly electrically connected or coupled to the other layer, region, or component or intervening layers, regions, or components may be present.

FIG. 1 is a schematic plan view of a display apparatus 10 according to an embodiment.

Referring to FIG. 1, the display apparatus 10 according to an embodiment includes a display area DA displaying an image, a first non-display area PA1 located outside the display area DA, and a second non-display area PA2 at least partially surrounded by the display area DA. In other words, the display area DA, the first non-display area PA1, and the second non-display area PA2 are defined in a substrate 100.

A display element is located in the display area DA, and the first non-display area PA1 may include a pad area PADA in which various electronic devices or a printed circuit board ("PCB") are electrically attached. First and second voltage lines 410 and 420 may be located in the first non-display area PA1.

The second non-display area PA2 may be at least partially surrounded by the display area DA, and at least one through hole H may be located in the second non-display area PA2. Although the second non-display area PA2 is located within the display area DA and thus the display area DA entirely surrounds the second non-display area PA2 in FIG. 1, embodiments according to the invention are not limited thereto. For example, a portion of the second non-display area PA2 may contact the first non-display area PA1 in another embodiment. Two or more through holes H may be provided within the second non-display area PA2 in still another embodiment.

The through holes H may be used as a space for an additional member for a function of the display apparatus 10 or an additional member capable of adding a new function to the display apparatus 10. For example, a sensor, a light source, and a camera module may be located in the through holes H. However, because the through hole H vertically penetrates the substrate 100 and a plurality of layers stacked on the substrate 100, external moisture or oxygen may infiltrate into an internal lateral surface of the display apparatus 10 that is exposed by the through hole H. However, according to an embodiment, at least one groove surrounding the through hole H is formed, thereby effectively preventing the infiltration of moisture.

FIG. 1 is a plan view illustrating the substrate 100 and the like during the manufacture of the display apparatus 10. In a final display apparatus 10 or an electronic device such as a smartphone including the display apparatus 10, a portion of the substrate 100 may be bent to minimize the area of the first non-display area PA1 that is recognized by a user in a plan view. In this case, the substrate 100 and the like are bent such that the pad area PADA is located at the rear of the display area DA, and accordingly, the user may recognize that the display area DA occupies most of the display apparatus 10 in a plan view.

The substrate 100 may include various suitable materials having flexible or bendable characteristics. For example, the substrate 100 may include a polymer resin, such as polyethersulfone ("PES"), polyacrylate, polyetherimide ("PEI"), polyethylene naphthalate ("PEN"), polyethylene terephthalate ("PET"), polyphenylene sulfide ("PPS"), polyarylate ("PAR"), polyimide ("PI"), polycarbonate ("PC"), or cellulose acetate propionate ("CAP"). The substrate 100 may have a multi-layered structure including two layers each including a polymer resin and a barrier layer including an inorganic material (e.g., silicon oxide, silicon nitride, silicon oxynitride, or the like) between the two layers. In this way, various modifications may be made.

Figure 2:
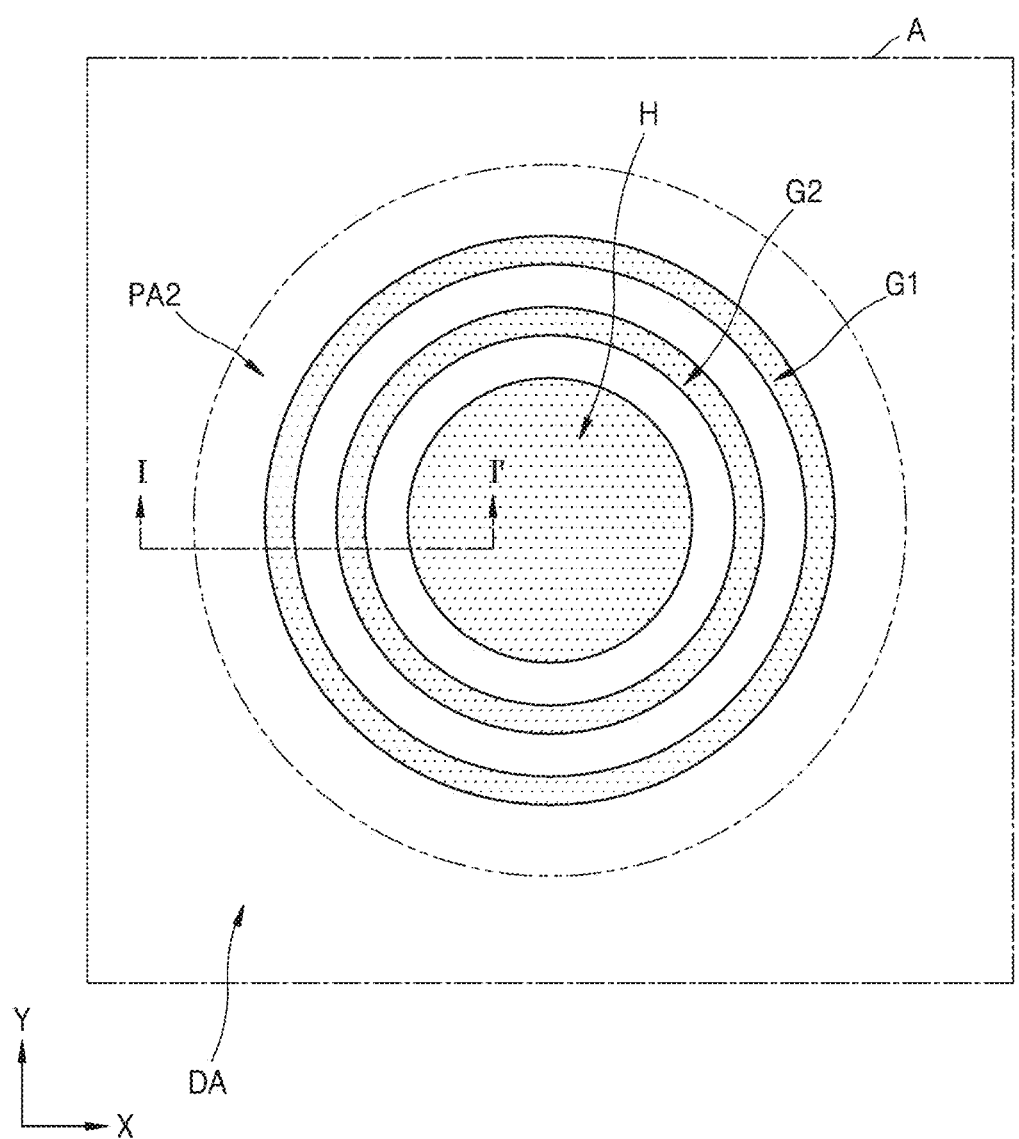
FIG. 2 is a schematic plan view of a region A of FIG. 1.
Figure 3:
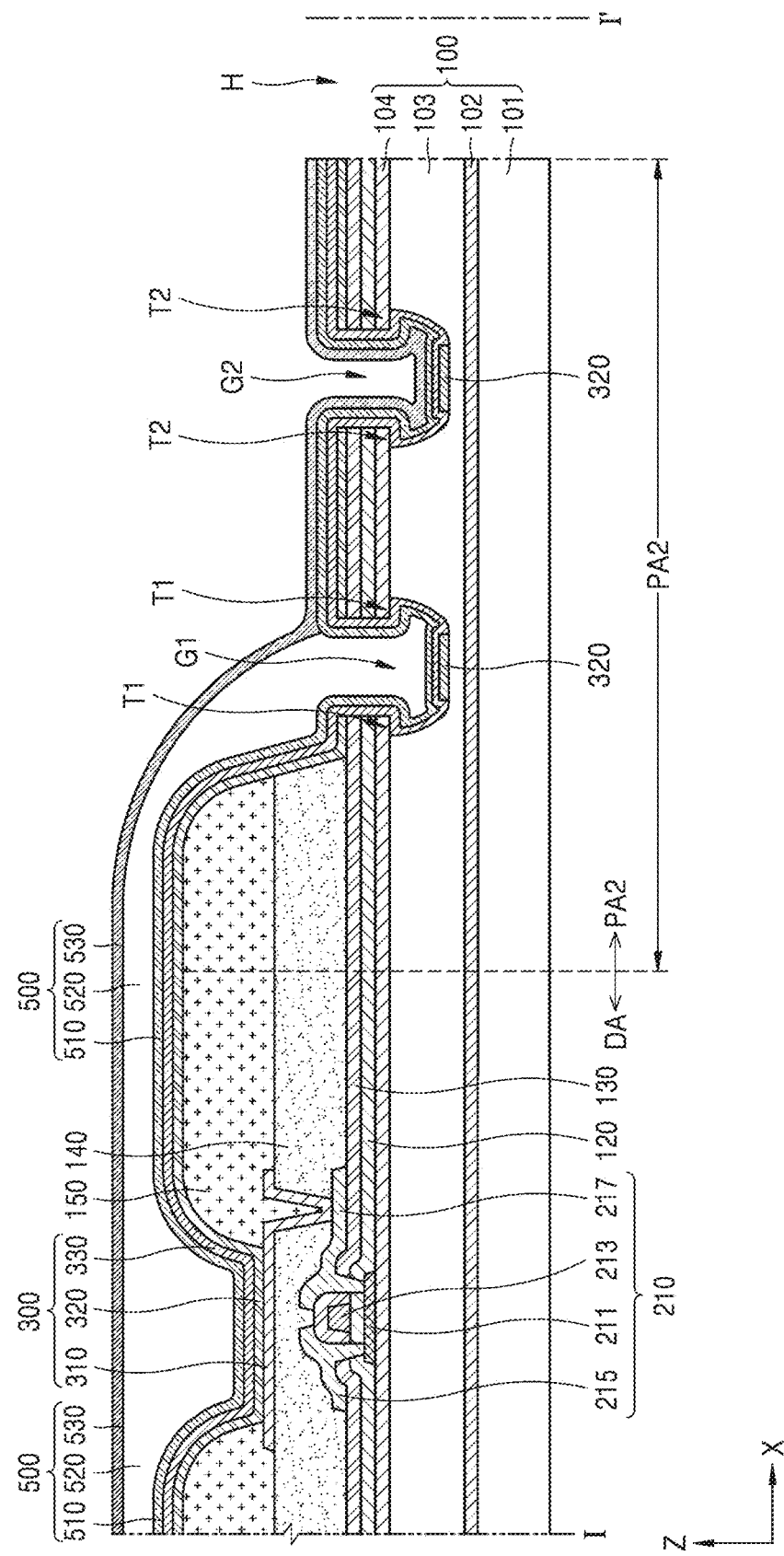
FIG. 3 is a cross-sectional view of the display apparatus taken along line I-I' of FIG. 2.

FIG. 2 is a plan view of a region A of FIG. 1, and FIG. 3 is a cross-sectional view of a cross-section of the region A taken along line I-I' of FIG. 2.

Referring to FIGS. 2 and 3, a first groove G1 and a second groove G2 may be in a region of the second display area PA2 that is located between the through hole H and the display area DA and may surround the through hole H. However, embodiments according to the invention are not limited thereto, and one groove or three or more grooves may be provided in another embodiment. In other words, one or more grooves may be provided around the through hole H. However, an example in which two grooves G1 and G2 (namely, the first and second grooves G1 and G2) are provided around the through hole H will now be described. The two grooves G1 and G2 will be referred to as the first groove G1 and the second groove G2 according to a distance from the through hole H. In other words, a groove that is arranged farthest from the through hole H is referred to as the first groove G1.

A thin-film transistor 210 and a display element are located on the substrate 100 in the display area DA. FIG. 3 illustrates an organic light-emitting diode 300 as the display element. Also, another thin-film transistor (not shown) may be arranged in the first non-display area PA1 (see FIG. 1) of the substrate 100. The another thin-film transistor located in the first non-display area PA1 of FIG. 1 may be a portion of a circuit unit for controlling an electrical signal applied to the display area DA.

The substrate 100 may have a multi-layered structure in which a first base layer 101, a first barrier layer 102, a second base layer 103, and a second barrier layer 104 are sequentially stacked.

The first base layer 101 and the second base layer 103 may include, for example, a transparent glass material containing $SiO_2$ as a main component. However, the materials included in the first base layer 101 and the second base layer 103 according to the invention are not limited thereto, and the first base layer 101 and the second base layer 103 may include a transparent plastic material in another embodiment. The plastic material may be polyethersulphone (PES), polyacrylate (PAR), polyetherimide (PEI), polyethyelenen napthalate (PEN), polyethyeleneterepthalate (PET), polyphenylene sulfide (PPS), polyarylate, polyimide, polycarbonate (PC), cellulose triacetate ("TAC"), cellulose acetate propionate (CAP), or the like.

The first base layer 101 and the second base layer 103 may have the same or different thicknesses. For example, each of the first base layer 101 and the second base layer 103 may include polyimide and may have a thickness of about 3 micrometers (μm) to about 20 μm.

Each of the first and second barrier layers 102 and 104 prevents infiltration of external foreign materials into the display apparatus 10 through the substrate 100, and may be a single layer or multiple layers including an inorganic material, such as SiNx and/or SiOx. For example, the first barrier layer 102 may be a multi-layer including an amorphous silicon layer and a silicon oxide layer for improving adhesion between neighboring layers, and the second barrier layer 104 may be a silicon oxide layer. Each of the first barrier layer 102 and the second barrier layer 104 may have a thickness of about 4000 angstroms (Å) to about 7000 Å, but embodiments according to the invention are not limited thereto.

A buffer layer may be further provided on the substrate 100. The buffer layer may planarize an upper surface of the substrate 100 and may block foreign matters or moisture from infiltrating through the substrate 100. For example, the buffer layer may include an inorganic material (such as silicon oxide, silicon nitride, silicon oxynitride, aluminum oxide, aluminum nitride, titanium oxide, or titanium nitride) or an organic material (such as polyimide, polyester, or acryl), or may be stacks of these materials. According to some embodiments, the second barrier layer 104 of the substrate 100 may be a portion of a buffer layer having a multi-layered structure.

The thin-film transistor 210 on the substrate 100 includes a semiconductor layer 211, a gate electrode 213, a source electrode 215, and a drain electrode 217. When the buffer layer is arranged on the substrate 100, the semiconductor layer 211 may be located on the buffer layer.

The semiconductor layer 211 may include amorphous silicon, polycrystalline silicon, or an organic semiconductor material.

The gate electrode 213 is arranged above the semiconductor layer 211. The source electrode 215 and the drain electrode 217 are electrically connected to each other in response to a signal applied to the gate electrode 213.

The gate electrode 213 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may have a single-layered or multi-layered structure. To secure insulation between the semiconductor layer 211 and the gate electrode 213, a first inorganic insulating layer 120 including an inorganic material, such as silicon oxide, silicon nitride, or silicon oxynitride, may be disposed between the semiconductor layer 211 and the gate electrode 213.

A second inorganic insulating layer 130 may be on the gate electrode 213, and may include an inorganic material, such as silicon oxide, silicon nitride, or silicon oxynitride and have a single-layered or multi-layered structure.

The source electrode 215 and the drain electrode 217 are on the second inorganic insulating layer 130. The source electrode 215 and the drain electrode 217 may be electrically connected to the semiconductor layer 211 via contact holes defined in the second inorganic insulating layer 130 and the first inorganic insulating layer 120. Each of the source electrode 215 and the drain electrode 217 may include at least one selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) and may have a single-layered or multi-layered structure, in consideration of conductivity or the like. For example, each of the source electrode 215 and the drain electrode 217 may be a three-layered layer of Ti/Al/Ti.

A planarization layer 140 may be on the thin-film transistor 210. For example, when the organic light-emitting diode 300 is on a higher location than the thin-film transistor 210 as illustrated in FIG. 3, the planarization layer 140 may cover the thin-film transistor 210 and planarize unevenness caused due to the thin-film transistor 210. The planarization layer 140 may include an organic insulating material, such as, acryl, benzocyclobutene ("BCB") or hexamethyldisiloxane ("HMDSO"). Although the planarization layer 140 is a single layer in FIG. 3, various modifications may be made to the planarization layer 140. For example, the planarization layer 140 may be a stack of multiple layers in another embodiment.

The organic light-emitting diode 300 is on the planarization layer 140, within the display area DA of the substrate 100. The organic light-emitting diode 300 includes the pixel electrode 310, an opposite electrode 330, and an intermediate layer 320 between the pixel electrode 310 and the opposite electrode 330 and including an emission layer.

The pixel electrode 310 is on the planarization layer 140. An opening that exposes at least one of the source electrode 215 and the drain electrode 217 of the thin-film transistor 210 is defined by the planarization layer 140, and the pixel electrode 310 may be electrically connected to the thin-film transistor 210 by contacting the source electrode 215 or the drain electrode 217 via the opening.

The pixel electrode 310 may be a transparent (or semi-transparent) electrode or a reflective electrode. When the pixel electrode 310 is a transparent (or semi-transparent) electrode, the pixel electrode 310 may include, for example, indium tin oxide ("ITO"), indium zinc oxide ("IZO"), zinc oxide (ZnO), indium oxide ($In_2O_3$), indium gallium oxide ("IGO"), or aluminum zinc oxide ("AZO"). When the pixel electrode 310 is a reflective electrode, the pixel electrode 310 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof, and a layer including ITO, IZO, ZnO, $In_2O_3$, IGO, or AZO. Of course, the disclosure according to the invention is not limited thereto, and the pixel electrode 310 may include any of various other materials and may have any of various structures, such as, a single-layered or multi-layered structure.

A pixel defining layer 150 may be on the planarization layer 140. The pixel defining layer 150 defines a pixel by an opening via which at least a center portion of the pixel electrode 310 is exposed. In a case as illustrated in FIG. 3, the pixel defining layer 150 prevents an arc from occurring on the edge of the pixel electrode 310 by increasing a distance between the edge of the pixel electrode 310 and the opposite electrode 330 arranged over the pixel electrode 310. The pixel defining layer 150 may include an organic insulating material, for example, polyimide or HMDSO.

The intermediate layer 320 of the organic light-emitting diode 300 includes the emission layer. The emission layer may include a low molecular or high molecular organic material that emits light of a certain color. The intermediate layer 320 may further include at least one functional layer from among a hole transport layer ("HTL"), a hole injection layer ("HIL"), an electron transport layer ("ETL"), and an electron injection layer ("EIL"). Such a functional layer may include an organic material. Some of the plurality of layers that constitute the intermediate layer 320, for example, a functional layer(s), may integrally extend over a plurality of pixel electrode 310.

The opposite electrode 330 may be arranged to cover the display area DA. The opposite electrode 330 may be formed as a single body constituting a plurality of organic light-emitting diodes 300, and thus may correspond to the plurality of pixel electrodes 310. The opposite electrode 330 may be a transparent (or semi-transparent) electrode or a reflective electrode. When the opposite electrode 330 is a transparent (or semi-transparent) electrode, the opposite electrode 330 may have a layer including a metal having a small work function, i.e., Li, Ca, LiF/Ca, LiF/Al, Al, Ag, Mg, or a compound thereof, and a transparent (or semi-transparent) conductive layer including, e.g., ITO, IZO, ZnO, or $In_2O_3$. When the opposite electrode 330 is a reflective electrode, the opposite electrode 330 may have a layer including Li, Ca, LiF/Ca, LiF/Al, Al, Ag, Mg, or a compound thereof. The configuration of the opposite electrode 330 and the material included in the opposite electrode 330 according to the invention are not limited to those described above, and various modifications may be made to the opposite electrode 330.

An encapsulation layer 500 is located above the opposite electrode 330. The encapsulation layer 500 protects the organic light-emitting diode 300 from external moisture or oxygen. To this end, the encapsulation layer 500 extends over the display area DA, in which the organic light-emitting diode 300 is located, and into the first non-display area PA1 outside the display area DA. The encapsulation layer 500 may have a multi-layered structure. In detail, as shown in FIG. 3, the encapsulation layer 500 may include a first inorganic encapsulation layer 510, an organic encapsulation layer 520, and a second inorganic encapsulation layer 530.

The first inorganic encapsulation layer 510 may include silicon oxide, silicon nitride, and/or silicon oxynitride. Because the first inorganic encapsulation layer 510 is formed along with structures below the first inorganic encapsulation layer 510, the upper surface of the first inorganic encapsulation layer 510 may not be flat, as shown in FIG. 3.

The organic encapsulation layer 520 covers the first inorganic encapsulation layer 510 and has a sufficient thickness, and thus the organic encapsulation layer 520 may have an approximately flat upper surface over the entire display area DA. The organic encapsulation layer 520 may include polyethylene terephthalate, polyethylene naphthalate, polycarbonate, polyimide, polyethylene sulfonate, polyoxymethylene, polyarylate, hexamethyldisiloxane, acryl-based resin (e.g., polymethyl methacrylate or polyacryl acid), or any combination thereof.

The second inorganic encapsulation layer 530 may cover the organic encapsulation layer 520 and may include a silicon oxide, a silicon nitride, and/or a silicon oxynitride. The second inorganic encapsulation layer 530 may extend beyond the organic encapsulation layer 520 and contact the first inorganic encapsulation layer 510 such that the organic encapsulation layer 520 may not be exposed to the outside.

In the second non-display area PA2, the first groove G1 and the second groove G2 surround the through hole H at positions spaced apart from the through hole H. The second groove G2 surrounds the through hole H at a position between the first groove G1 and the through hole H.

Each of the first groove G1 and the second groove G2 may have an undercut structure. For example, each of the first groove G1 and the second groove G2 may extend from the second barrier layer 104 of the substrate 100 to at least a portion of the second base layer 103 in a thickness direction of the substrate 100. As used herein, the term "thickness direction of a substrate" refers to a direction perpendicular to a major surface plane (i.e., a plane defined by the directions X and Y in the figures) defining the substrate, like the direction Z in FIG. 3.

In this state, the second barrier layer 104 may include a pair of first tips T1 extending toward each other with the first groove G1 therebetween in an open upper end of the first groove G1, and a pair of second tips T2 extending toward each other with the second groove G2 therebetween in an open upper end of the second groove G2.

The first groove G1 and the second groove G2 may be formed by defining openings in respective portions of the second barrier layer 104 where the first groove G1 and the second groove G2 are respectively to be defined, and then conducting dry etching to remove parts of the second base layer 103 through the openings. Thus, the parts of the second base layer 103 may be removed to define a cavity that is wider than each of the openings of the second barrier layer 104.

Accordingly, a width of the open upper end of the first groove G1 may be less than a width of the bottom of the first groove G1, and the second barrier layer 104 in the open upper end of the first groove G1 may include a pair of first tips T1 facing each other. The first tips T1 may each have a cantilever shape. The width of the first groove G1 is a distance measured in a direction perpendicular to a lengthwise direction of the first groove G1. For example, when the first groove G1 has a shape of a circular ring, the width of the first groove G1 is in a radial direction of the circular ring. Here, the radial direction is in the major surface plane of the substrate 100 such that the radial direction is perpendicular to the thickness direction of the substrate 100. When a buffer layer is further provided on the substrate 100, the buffer layer may define the first tips T1 together with the second barrier layer 104.

Similarly, the second barrier layer 104 may include a pair of second tips T2 extending toward each other with the second groove G2 therebetween in the upper opening of the second groove G2 and surrounding the through hole H, and the second groove G2 may have an undercut structure.

Because some of the plurality of layers that constitute the intermediate layer 320, for example, a functional layer(s), may extend over a plurality of organic light-emitting diodes 300 as described above, these layers are formed not only in the display area DA but also in the second non-display area PA2. However, the intermediate layer 320 may not be disposed on respective inner wall surfaces in the open upper end of the first and second grooves G1 and G2 due to the undercut structures respectively formed by the first tips T1 and the second tips T2, and may only be formed on respective partial areas of the respective bottom surfaces of the first and second grooves G1 and G2.

Accordingly, organic layers included in the intermediate layer 320 are disconnected by the first and second grooves G1 and G2, and thus external moisture or oxygen may be prevented from infiltrating into the display area DA from the through hole H along the organic layers in the intermediate layer 320.

The encapsulation layer 500 is provided not only in the display area DA where the organic light-emitting diode 300 is located, but also in the second non-display area PA2.

As described above, the functional layer(s) included in the intermediate layer 320 is not formed on the respective inner wall surfaces in the open upper end of the first and second grooves G1 and G2 due to the undercut structures of the first and second grooves G1. However, because the first inorganic encapsulation layer 510 of the encapsulation layer 500 is conformally formed via chemical vapor deposition or the like, the first inorganic encapsulation layer 510 may be formed not only on the bottom surfaces of the first and second grooves G1 and G2 but also on the inner wall surfaces in the open upper end of the first and second grooves G1 and G2 and the lower surfaces of the first and second tips T1 and T2. Thus, the first inorganic encapsulation layer 510 may be continuously formed without being disconnected.

The organic encapsulation layer 520 may fill the first groove G1. Accordingly, when the organic encapsulation layer 520 is formed, a material used to form the organic encapsulation layer 520 may be prevented from flowing toward the second groove G2, and thus an area where the organic encapsulation layer 520 is formed may be limited.

The second inorganic encapsulation layer 530 may be formed similarly to the first inorganic encapsulation layer 510. Thus, the second inorganic encapsulation layer 530 and the first inorganic encapsulation layer 510 may contact each other in the second groove G2, and accordingly may effectively prevent infiltration of external moisture and oxygen.

Figure 4:
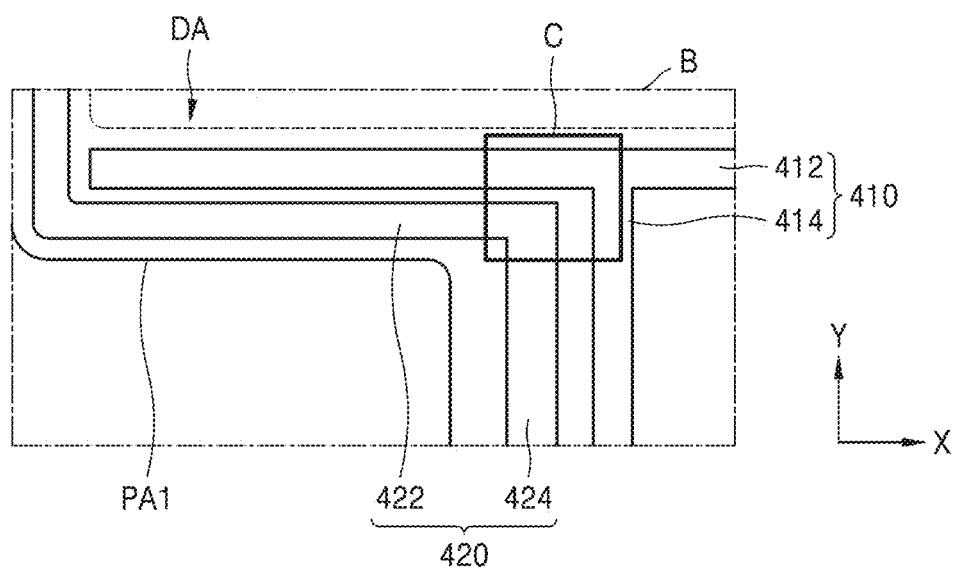
FIG. 4 is a schematic plan view of a region B of FIG. 1.
Figure 5:
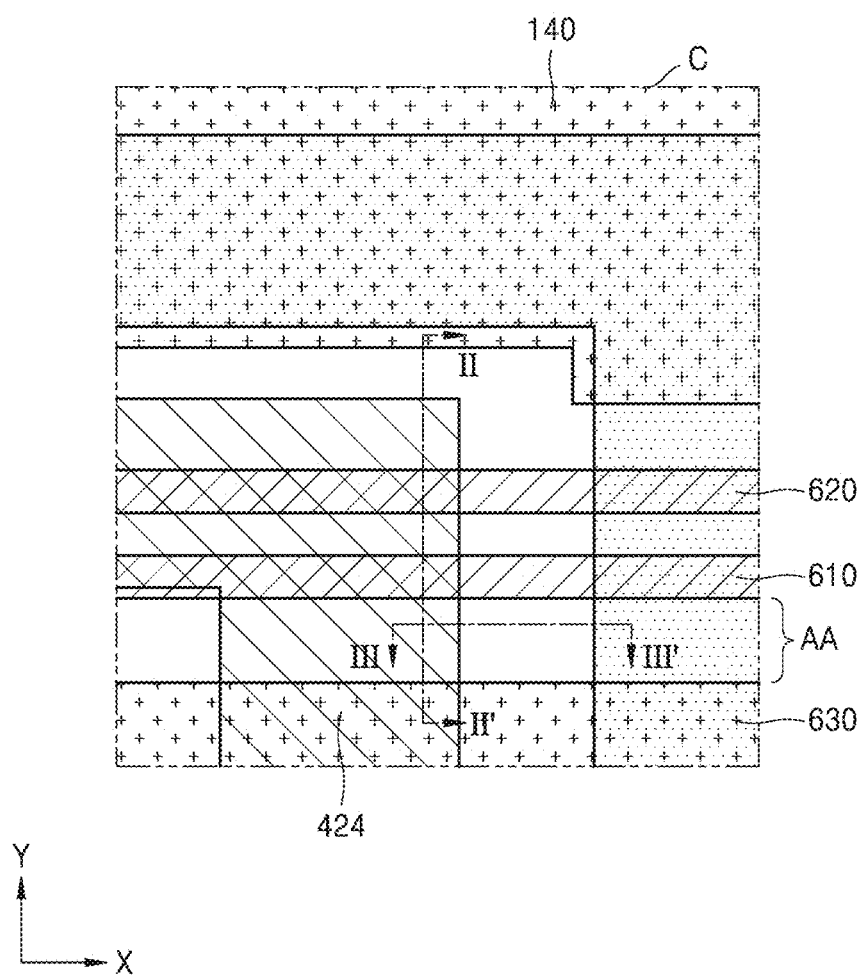
FIG. 5 is a schematic plan view of a region C of FIG. 4.
Figure 6:
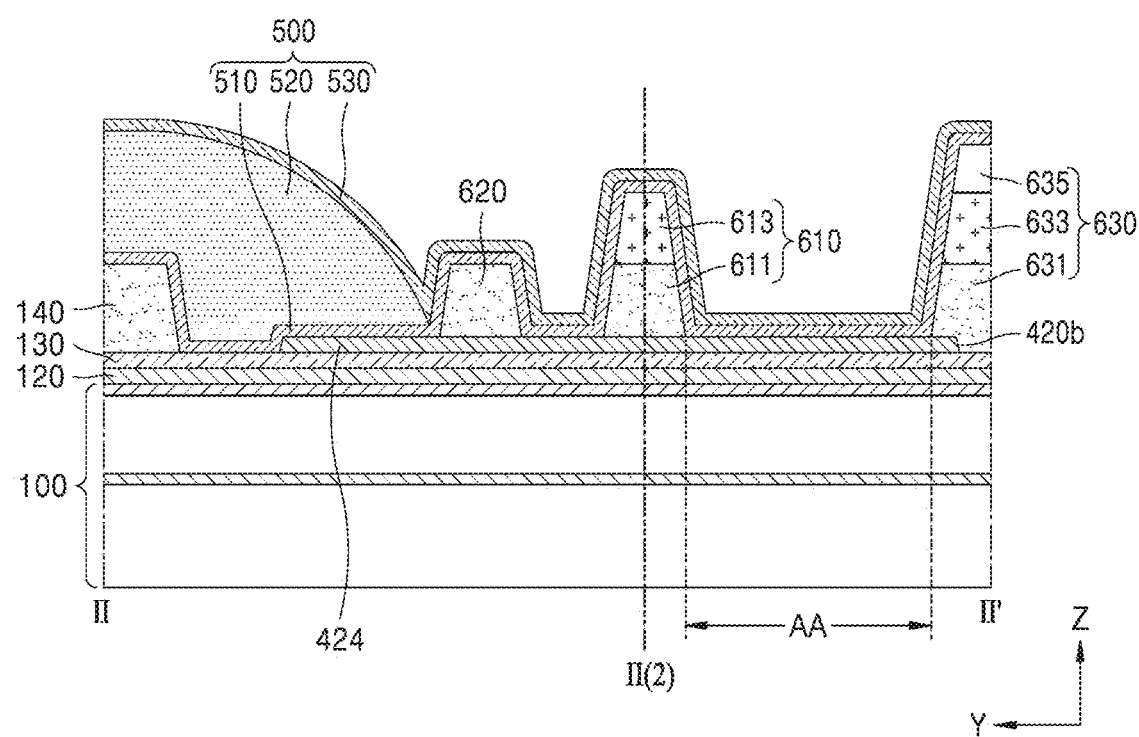
FIG. 6 is a cross-sectional view of the region C taken along line II-II' of FIG. 5.
Figure 7:
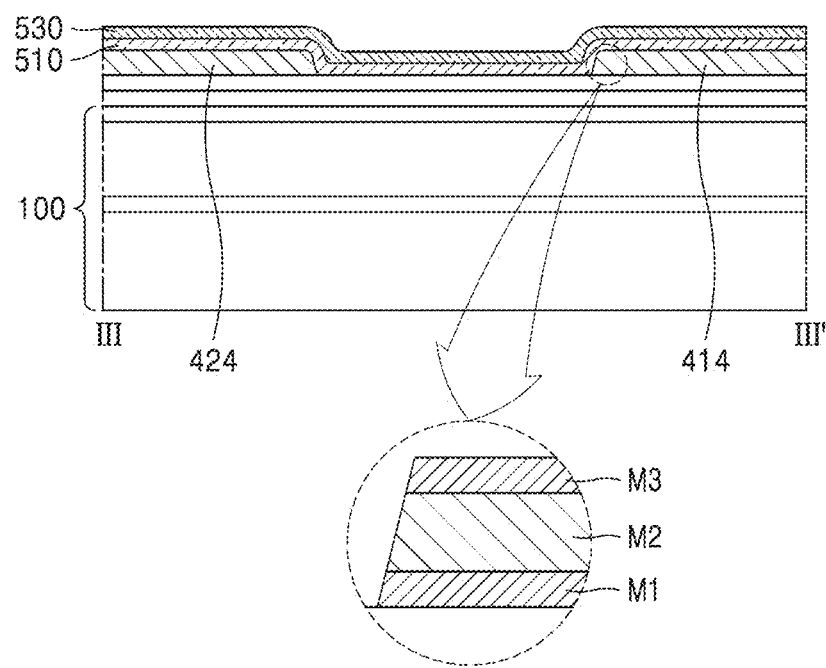
FIG. 7 is a cross-sectional view of the region C taken along line III-III' of FIG. 5.

FIG. 4 is a plan view of a region B of FIG. 1, FIG. 5 is a plan view of a region C of FIG. 4, FIG. 6 is a cross-sectional view of an example of a cross-section taken along line II-II' of FIG. 5, and FIG. 7 is a cross-sectional view of an example of a cross-section taken along line III-III' of FIG. 5.

Referring to FIGS. 4 through 7, the first voltage line 410 and the second voltage line 420 may be located in the first non-display area PA1 to supply driving power to the organic light-emitting diode 300 of FIG. 3. For example, the first voltage line 410 may be a driving voltage line, and the second voltage line 420 may be a common voltage line. The second voltage line 420 may be directly connected to the opposite electrode 330 of FIG. 3 or be connected to the opposite electrode 330 through another line. The first voltage line 410 and the second voltage line 420 may be simultaneously formed while the source electrode 215 of FIG. 3 and the drain electrode 217 of FIG. 3 are formed in the manufacturing process, and may include the same material as those of the source electrode 215 and the drain electrode 217. For example, as shown in FIG. 7, the first voltage line 410 and the second voltage line 420 may be a three-layered layer in which a first metal layer M1, a second metal layer M2, and a third metal layer M3 are stacked. The first metal layer M1 and the third metal layer M3 may include Ti, and the second metal layer M2 may include Al.

The first voltage line 410 may be arranged between one side of the display area DA and the pad area PADA of FIG.

1. The first voltage line 410 may include a first main voltage line 412 and a first connection unit 414 arranged to correspond to one side of the display area DA. For example, when the display area DA is rectangular, the first main voltage line 412 may be arranged to correspond to one edge of the display area DA. The first main voltage line 412 may be parallel to the one edge the display area DA and may have a length equal to or greater than the length of the one edge. The one edge that corresponds to the first main voltage line 412 may be an edge the display area DA that is adjacent to the pad area PADA of FIG. 1.

The first connection unit 414 may protrude from the first main voltage line 412 and extend in a direction toward the pad area PDAD of FIG. 1, and thus may be connected to a pad unit (not shown).

The second voltage line 420 may surround the remaining regions of the display area DA. The second voltage line 420 may include a second main voltage line 422 surrounding both ends of the first main voltage line 412 and the remaining regions of the display area DA, and a second connection unit 424 extending from the second main voltage line 422 and arranged parallel to the first connection unit 414. The second connection unit 424 may be connected to a pad unit (not shown).

As shown in FIG. 5, a portion of the planarization layer 140 is removed in the first non-display area PA1. A region of the first non-display area PA1 from which the planarization layer 140 has been removed surrounds the display area DA. Accordingly, infiltration of external moisture into the display area DA via the planarization layer 140 formed of an organic material may be prevented.

When the encapsulation layer 500 is formed or, in further detail, when the organic encapsulation layer 520 is formed, a material used to form the organic encapsulation layer 520 needs to be confined to be coated within a preset area. To this end, as shown in FIGS. 5 and 6, a first dam 610 may be located within the first non-display area PA1. The first dam 610 may be located within the first non-display area PA1 to be apart from the planarization layer 140, and may surround the display area DA.

The first dam 610 may have a multi-layered structure. For example, as shown in FIG. 6, the first dam 610 may have a structure in which a lower layer 611 and an upper layer 613 are stacked. For example, the lower layer 611 may be formed using the same material as the material used to form the planarization layer 140 and formed simultaneously with the formation of the planarization layer 140, and the upper layer 613 may be formed using the same material as the material used to form the pixel defining layer 150 and formed simultaneously with the formation of the pixel defining layer 150.

A second dam 620 may be further located inside the first dam 610. That is, the second dam 620 may be located between the first dam 610 and the display area DA. The second dam 620 may be formed using the same material as the material used to form the planarization layer 140 or the pixel defining layer 150, and formed simultaneously with the formation of the planarization layer 140 or the pixel defining layer 150. The second dam 620 may have a height that is lower than the height of the first dam 610 in the direction Z.

The first dam 610 and the second dam 620 may surround the display area DA to block a material used to form the organic encapsulation layer 520 from spreading toward the edge of the substrate 100, thereby restricting a location of the organic encapsulation layer 520 and preventing formation of an edge tail of the organic encapsulation layer 520.

A bank 630 may be further located outside the first dam 610. The bank 630 may surround the first dam 610. The bank 630 supports masks that are used to form the intermediate layer 320 of FIG. 3 or the opposite electrode 330 of FIG. 3 of the organic light-emitting diode 300 of FIG. 3 during the manufacture of the display apparatus 10 of FIG. 1. At this time, the bank 630 may prevent previously-formed components from contacting and damaging the masks. For example, the bank 630 may have a structure in which a first layer 631, a second layer 633, and a third layer 635 are stacked. The first layer 631 may be formed using the same material as the material used to form the planarization layer 140 and formed simultaneously with the formation of the planarization layer 140, and the second layer 633 may be formed using the same material as the material used to form the pixel defining layer 150 and formed simultaneously with the formation of the pixel defining layer 150. The third layer 635 may be formed on the second layer 633 by using the same material as the material used to form the second layer 633. For example, the third layer 635 may be formed together with the second layer 633 by using a halftone mask during the formation of the pixel defining layer 150.

The first dam 610, the second dam 620, and the bank 630 are located in the region of the first non-display area PA1 from which the planarization layer 140 has been removed. In this case, the first inorganic encapsulation layer 510 and the second inorganic encapsulation layer 530 may cover the bank 630 as shown in FIG. 6, and may extend to the outside of the bank 630. Accordingly, an area between the first dam 610 and the bank 630 may be defined as an adhesion area AA including only inorganic layers. Because the first inorganic encapsulation layer 510 directly contacts the second inorganic encapsulation layer 530 and another inorganic layer below the second inorganic encapsulation layer 530, for example, the second inorganic insulating layer 130, in the adhesion area AA, a bonding strength of the thin-film encapsulation layer 500 may improve and thus infiltration of external moisture and oxygen may be more effectively prevented.

When the planarization layer 140 is removed in the first non-display area PA1, the first voltage line 410 and the second voltage line 420 located below the planarization layer 140 may be partially exposed, and the exposed portions of the first voltage line 410 and the second voltage line 420 may directly contact the first inorganic encapsulation layer 510. In particular, in the adhesion area AA, as shown in FIG. 7, the planarization layer 140 is removed and thus the first connection unit 414 and the second connection unit 424 are exposed, and the first inorganic encapsulation layer 510 and the second inorganic encapsulation layer 530 are provided directly on the exposed first and second connection units 414 and 424.

The planarization layer 140 may be patterned by performing wet etching via, for example, a photolithographic process. At this time, the first voltage line 410 and the second voltage line 420 that are exposed to a developing solution for etching the planarization layer 140 may be damaged.

In detail, when each of the first voltage line 410 and the second voltage line 420 is a three-layered layer including the first metal layer M1, the second metal layer M2, and the third metal layer M3, an etch rate of the second metal layer M2 including Al is greater than the etch rate of each of the first and third metal layers M1 and M3 including Ti. Accordingly, the second metal layer M2 exposed to the developing solution while the planarization layer 140 is being removed via wet etching in the adhesion area AA is more excessively etched than the first metal layer M1 and the third metal layer M3, and thus the lateral surfaces of the first connection unit 414 and the second connection unit 424 may establish an undercut structure. In this state, when the first inorganic encapsulation layer 510 and the second inorganic encapsulation layer 530 are formed, a step coverage may be degraded at the lateral surfaces of the first connection unit 414 and the second connection unit 424, and thus a damage, such as a crack, may be generated in the first inorganic encapsulation layer 510 and the second inorganic encapsulation layer 530.

The first voltage line 410 and the second voltage line 420 may also be damaged by the developing solution between the first dam 610 and the second dam 620 and between the second dam 620 and the display area DA. However, because the organic encapsulation layer 520 is provided on the first inorganic encapsulation layer 510 between the second dam 620 and the display area DA, and the area of a space between the first dam 610 and the second dam 620 is smaller than the adhesion area AA, even when damage to the first voltage line 410 and the second voltage line 420 due to the developing solution occurs between the first dam 610 and the second dam 620 and between the second dam 620 and the display area DA, the probability that the first inorganic encapsulation layer 510 and the second inorganic encapsulation layer 530 are directly damaged may be low. Thus, it is important to prevent an undercut structure from being established on the respective lateral surfaces of the first and second connection units 414 and 424 while the planarization layer 140 is being removed in the adhesion area AA. A method of manufacturing the display apparatus 10 of FIG. 1 of which the lateral surfaces of the first and second connection units 414 and 424 exposed in the adhesion area AA are not damaged will now be described with reference to FIGS. 8 through 12.

FIGS. 8 through 12 are cross-sectional views schematically illustrating a method of manufacturing the display apparatus 10, according to an embodiment. Each of FIGS. 8 through 12 illustrates the I-I' cross-section of FIG. 2 and a cross-section of a II(2)-II' region of FIG. 6.

The method of manufacturing the display apparatus 10 will now be described with reference to FIGS. 8 through 12 together with FIG. 1. As described above, the display apparatus 10 may include the display area DA, the first non-display area PA1 located outside the display area DA, and the second non-display area PA2 at least partially surrounded by the display area DA.

The method of manufacturing the display apparatus 10 may include an operation of forming the thin-film transistor 210 at a location corresponding to the display area DA, on the substrate 100, and forming the planarization layer 140 to cover the thin-film transistor 210, an operation of forming the pixel electrode 310 electrically connected to the thin-film transistor 210 and the pixel defining layer 150 exposing at least the center of the pixel electrode 310, on the planarization layer 140, an operation of forming at least one groove at a location corresponding to the second non-display area PA2, an operation of forming the intermediate layer 320 including the emission layer on the pixel electrode 310 and forming the opposite electrode 330 on the intermediate layer 320, an operation of forming the encapsulation layer 500 by sequentially stacking the first inorganic encapsulation layer 510, the organic encapsulation layer 520, and the second inorganic encapsulation layer 530 on the opposite electrode 330, and an operation of defining the through hole H within a region where at least one groove is defined. A structure in which the first groove G1 and the second groove G2 surround the through hole H will now be described.

The substrate 100 may have a multi-layered structure in which the first base layer 101, the first barrier layer 102, the second base layer 103, and the second barrier layer 104 are sequentially stacked.

The thin-film transistor 210 includes the semiconductor layer 211, the gate electrode 213, the source electrode 215, and the drain electrode 217. At this time, the first inorganic insulating layer 120 between the semiconductor layer 211 and the gate electrode 213 and the second inorganic insulating layer 130 between the gate electrode 213 and the source and drain electrodes 215 and 217 may be formed to correspond to the entire substrate 100. In other words, the first inorganic insulating layer 120 and the second inorganic insulating layer 130 may be formed in both the first display area PA1 and the second non-display area PA2.

When the thin-film transistor 210 is formed, the first voltage line 410 and the second voltage line 420 may be formed together in the first non-display area PA1. The first voltage line 410 and the second voltage line 420 may be simultaneously formed while the source electrode 215 and the drain electrode 217 are formed.

After the planarization layer 140 is formed, at least a portion of the planarization layer 140 that corresponds to the second non-display area PA2 may be removed via patterning. At this time, a portion of the planarization layer 140 existing between at least the pad area PADA in the first non-display area PA1 and the display area DA is not removed during patterning. Accordingly, the first voltage line 410 and the second voltage line 420 covered by the planarization layer 140 between the pad area PADA and the display area DA are not exposed due to patterning of the planarization layer 140, and thus may be prevented from being damaged while the planarization layer 140 is being patterned.

After the pixel defining layer 150 is formed, at least a portion of the pixel defining layer 150 that corresponds to the second non-display area PA2 may be removed via patterning. At this time, a portion of the pixel defining layer 150 formed on the planarization layer 140 between the pad area PADA and the display area DA may be patterned to form the first dam 610 and the bank 630. Because the first voltage line 410 and the second voltage line 420 are covered by the planarization layer 140 between the pad area PADA and the display area DA, the first voltage line 410 and the second voltage line 420 are not exposed while the pixel defining layer 150 is being patterned. However, embodiments according to the invention are not limited thereto, and a portion of the pixel defining layer 150 on the planarization layer 140 that is between the pad area PADA and the display area DA may be removed together with the planarization layer 140 in another embodiment.

Figure 8:
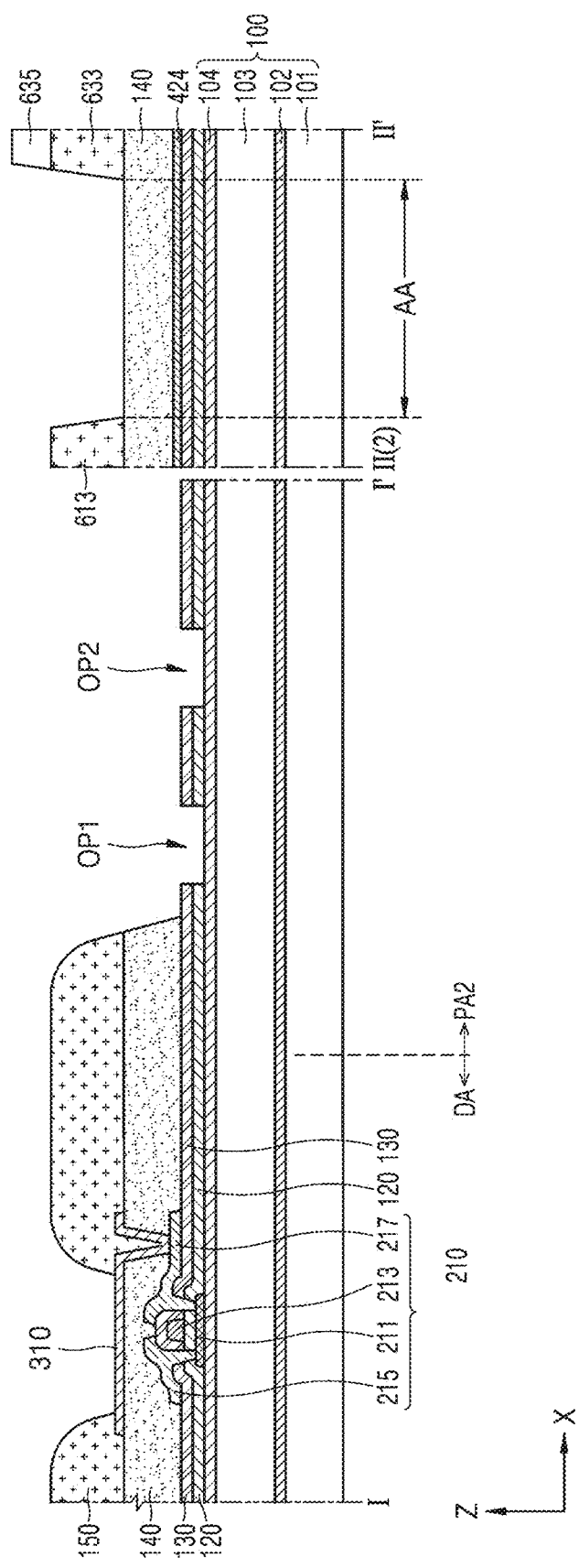
FIGS. 8 through 12 are cross-sectional views schematically illustrating a method of manufacturing a display apparatus, according to an embodiment.

As shown in FIG. 8, in the second non-display area PA2, openings OP1 and OP2 may be defined in portions of the first inorganic insulating layer 120 and the second inorganic insulating layer 130 where the first groove G1 and the second groove G2 are to be defined.

Figure 9:
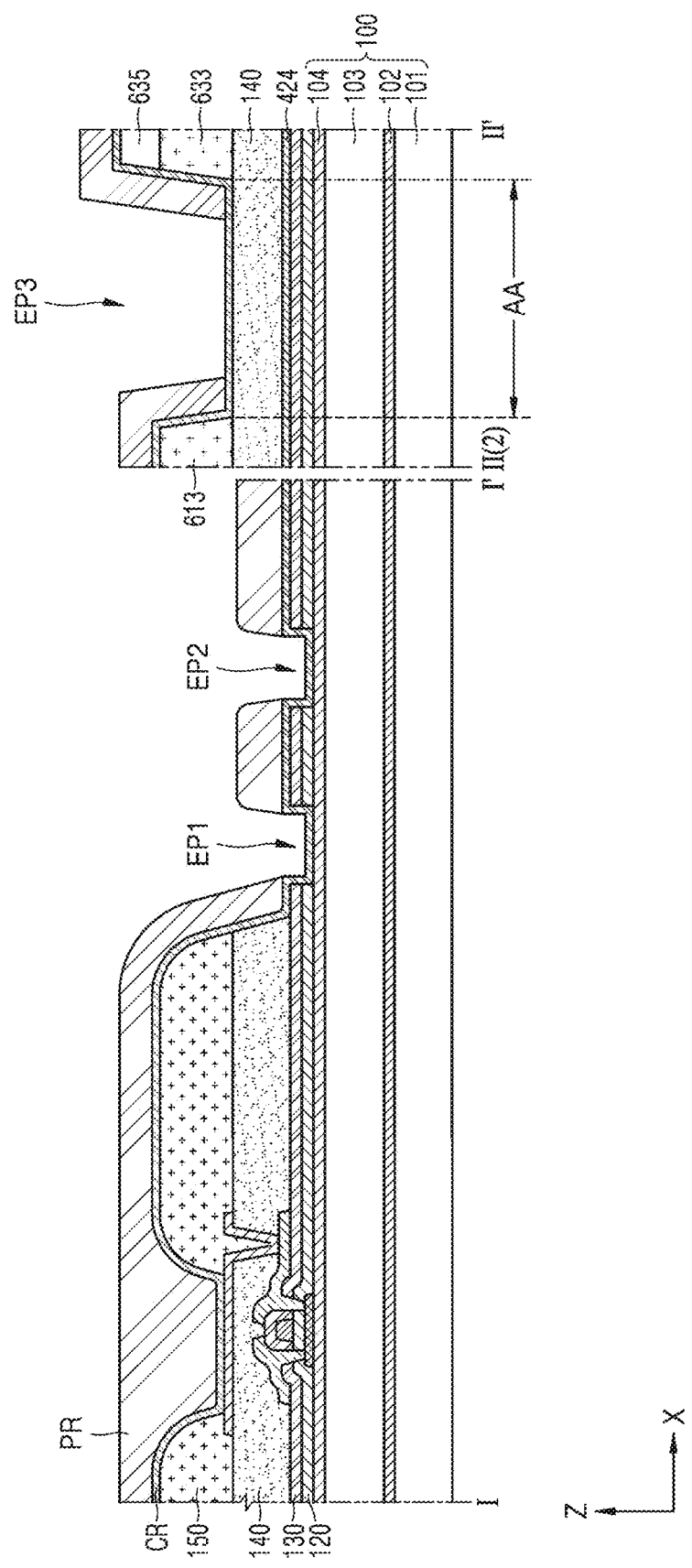

Next, referring to FIG. 9, a cover layer CR is formed on the entire substrate 100, and then exposed portions of the cover layer CR that respectively correspond to the first groove G1, the second groove G2, and the adhesion area AA are removed using a photosensitive layer PR including exposure regions EP1, EP2, and EP3 that expose the cover layer CR.

Figure 10:
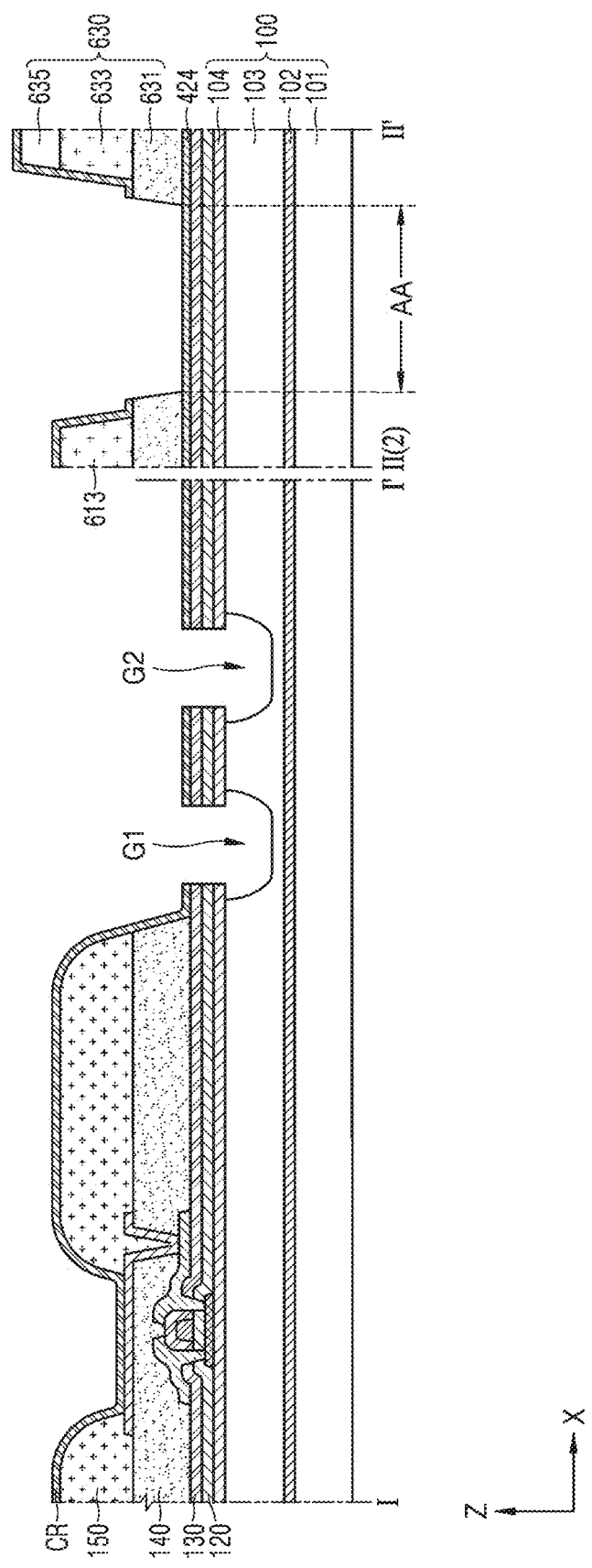

Then, as shown in FIG. 10, the photosensitive layer PR is removed, and then dry etching is conducted using the cover layer CR as a mask. Due to the dry etching, the first groove G1 and the second groove G2 may be formed in the second non-display area PA2, and the planarization layer 140 may be removed in the adhesion area AA. Each of the first groove G1 and the second groove G2 may have a closed curve shape.

Each of the first groove G1 and the second groove G2 extends from the surface of the substrate 100 in a thickness direction of the substrate 100. In this state, the pair of first tips T1 extending toward each other with the first groove G1 therebetween in the open upper end of the first groove G1, and the pair of second tips T2 extending toward each other with the second groove G2 therebetween in the open upper end of the second groove G2 may be formed in the second barrier layer 104.

By removing the planarization layer 140 from between the pad area PADA and the display area DA, the first dam 610 and the bank 630 surrounding the display area DA are formed. At this time, because the planarization layer 140 is removed from the adhesion area AA between the first dam 610 and the bank 630, the lateral surfaces of the first connection unit 414 and the second connection unit 424 do not have undercut structures in contrast with a case where the first connection unit 414 and the second connection unit 424 are exposed to a developing solution due to the removal of the planarization layer 140.

Figure 11:
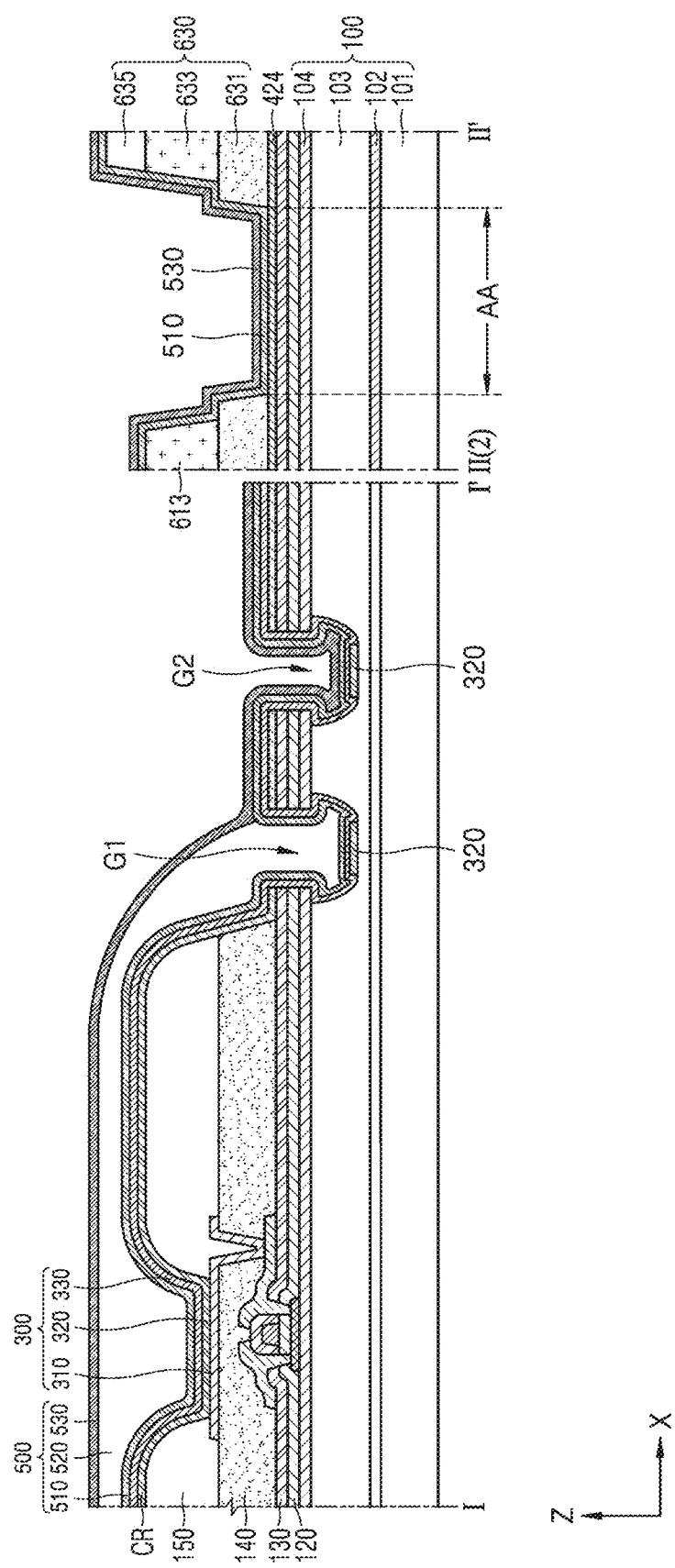
Figure 12:
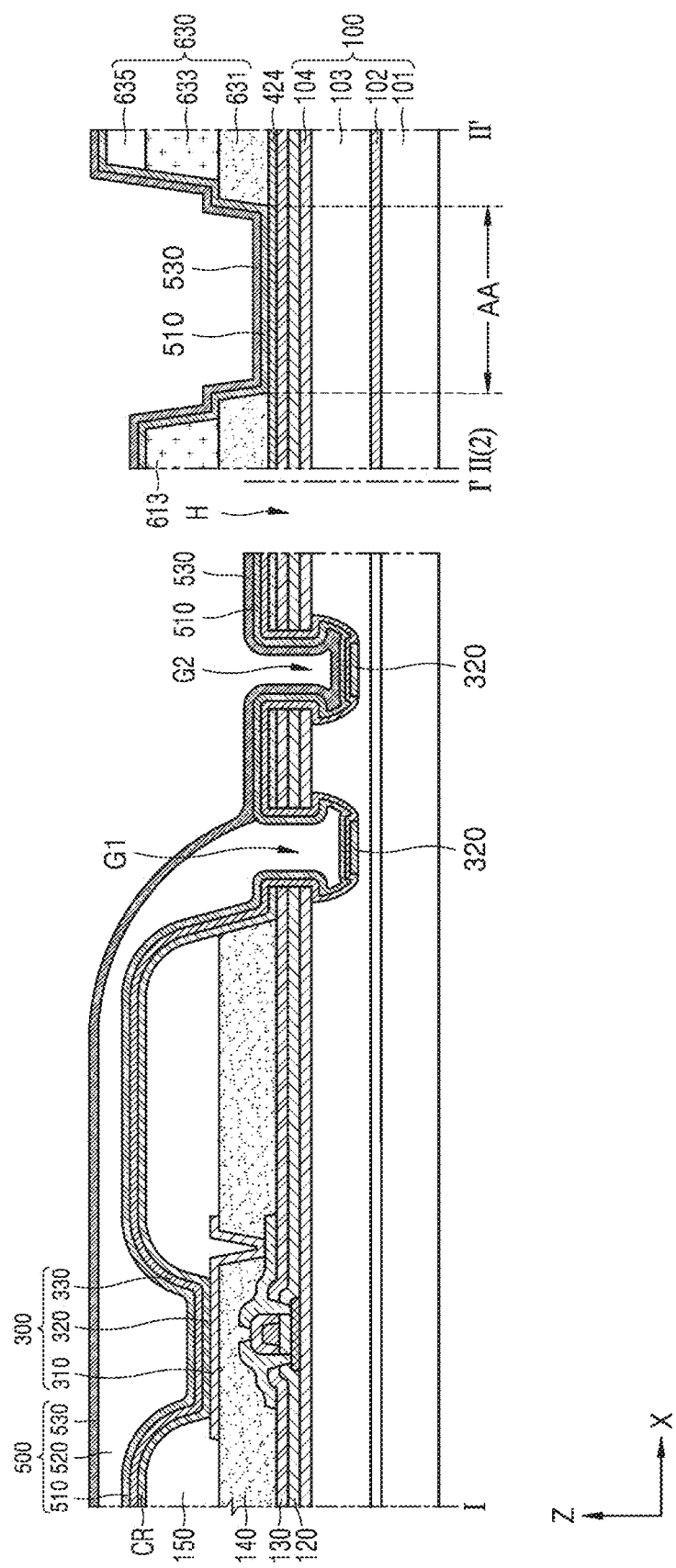

Next, as shown in FIG. 11, after the cover layer CR is removed, the intermediate layer 320 and the opposite electrode 330 are formed on the pixel electrode 310, and the encapsulation layer 500 is formed on the opposite electrode 330. Then, as shown in FIG. 12, the through hole H is defined.

The cover layer CR may be removed via wet etching. At this time, effects of an etchant on the components of the display apparatus 10 of FIG. 1 during the removal of the cover layer CR may be prevented or minimized by increasing a selectivity of the cover layer CR with respect to the etchant. For example, the cover layer CR may include at least one of tin indium oxide, zinc indium oxide, tin zinc indium oxide, gallium zinc oxide, and gallium zinc indium oxide.

Some of the plurality of layers that constitute the intermediate layer 320, for example, a functional layer(s), may be formed to extend over the entire display area DA. At this time, the intermediate layer 320 may not be formed on respective inner wall surfaces in the open upper end of the first and second grooves G1 and G2 due to the undercut structures respectively formed by the first tips T1 and the second tips T2, and thus may be discontinuously formed by being disconnected.

When the first groove G1 is formed to surround the second groove G2, the first groove G1 may be filled with the organic encapsulation layer 520, but the second groove G2 is not filled with the organic encapsulation layer 520. The first inorganic encapsulation layer 510 and the second inorganic encapsulation layer 530 may directly contact each other in the second groove G2.

In the adhesion area AA, the first inorganic encapsulation layer 510 may directly contact the second inorganic encapsulation layer 530, and contact the exposed portions of the first voltage line 410 and the second voltage line 420. In more detail, in the adhesion area AA, the first inorganic encapsulation layer 510 covers the first and second connection units 414 and 424. At this time, the undercut structure due to excessive etching is not generated in the lateral surfaces of the first and second connection units 414 and 424, and thus a gap or the like is not formed between the first inorganic encapsulation layer 510 and the first and second connection units 414 and 424. Accordingly, damage such as cracking may be prevented from occurring in the first inorganic encapsulation layer 510 and the second inorganic encapsulation layer 530.

The through hole H may be defined in the region where the first groove G1 or the second groove G2 is defined. For example, when the first groove G1 is defined to surround the second groove G2, the through hole H may be located within the area formed by the second groove G2. The through hole H may be defined by, for example, radiating laser to the substrate 100 to penetrate through the substrate 100 from the encapsulation layer 500.

According to embodiments of the disclosure, an encapsulation layer is not damaged by preventing an undercut structure from being generated on the lateral surfaces of power lines exposed between a pad area and a display area, and thus infiltration of external moisture or oxygen into a display apparatus may be effectively prevented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus including a display area, a first non-display area located around the display area and including a pad area on one side of the first non-display area, and a second non-display area at least partially surrounded by the display area, the method comprising:
   forming a thin-film transistor on a substrate at a location corresponding to the display area, and forming a planarization layer to cover the thin-film transistor;
   forming, on the planarization layer, a pixel electrode electrically connected to the thin-film transistor and a pixel defining layer exposing at least a center portion of the pixel electrode; and
   defining, at a location corresponding to the second non-display area, at least one groove extending from a surface of the substrate in a thickness direction of the substrate, the at least one groove having a closed curve shape,
   wherein, when the thin-film transistor is formed, a voltage line for applying a voltage to the display apparatus is formed together with the thin-film transistor at a location corresponding to the first non-display area, and
   when the at least one groove is formed, a portion of the planarization layer disposed between the pad area and the display area is simultaneously removed such that a portion of the voltage line between the pad area and the display area is exposed.

2. The method of claim 1, wherein the substrate has a multi-layered structure in which a first base layer, a first barrier layer, a second base layer, and a second barrier layer are sequentially stacked, and
   the at least one groove is defined to extend from the second barrier layer to at least a portion of the second base layer in the thickness direction of the substrate.

3. The method of claim 1, wherein, before the forming of the at least one groove, a cover layer is formed on the entire substrate, the cover layer is patterned to define openings in the cover layer at a location where the at least one groove to be defined and a location between the pad area and the display area, and forming the at least one groove and removing a portion of the planarization layer disposed between the pad area and the display area is performed via the openings.

4. The method of claim 3, wherein the at least one groove is formed and the portion of the planarization layer disposed between the pad area and the display area is removed by performing dry etching using the cover layer as a mask.

5. The method of claim 3, wherein the cover layer includes at least one of tin indium oxide, zinc indium oxide, tin zinc indium oxide, gallium zinc oxide, and gallium zinc indium oxide.

6. The method of claim 1, wherein, when the portion of the planarization layer disposed between the pad area and the display area is removed, a first dam and a bank which surround the display area are formed, and the voltage line is exposed in an adhesion area between the first dam and the bank.

7. The method of claim 6, further comprising:
forming an intermediate layer including an emission layer on the pixel electrode and an opposite electrode on the intermediate layer;
sequentially forming a first inorganic encapsulation layer, an organic encapsulation layer, and a second inorganic encapsulation layer on the opposite electrode; and
defining a through hole within an area defined by the at least one groove.

8. The method of claim 7, wherein the first inorganic encapsulation layer directly contacts the voltage line and the second inorganic encapsulation layer in the adhesion area.

9. The method of claim 7, wherein the at least one groove includes a first groove which surrounds the through hole, and a second groove which is located between the first groove and the through hole and surrounds the through hole,
the organic encapsulation layer fills the first groove, and
the first inorganic encapsulation layer and the second inorganic encapsulation layer directly contact each other within the second groove.

10. The method of claim 5, wherein the emission layer is disconnected by the at least one groove and is discontinuously formed.

11. The method of claim 7, wherein the thin-film transistor comprises a semiconductor layer, a gate electrode, a source electrode, and a drain electrode,
a first inorganic insulating layer is formed between the semiconductor layer and the gate electrode to correspond to the entire substrate, and a second inorganic insulating layer is formed between the gate electrode and the source and drain electrodes to correspond to the entire substrate, and
the first inorganic encapsulation layer directly contacts the second inorganic insulating layer in the adhesion area.

12. The method of claim 6, wherein the pixel defining layer is formed on the planarization layer and disposed between the pad area and the display area, and
when the at least one groove is formed, the pixel defining layer and the planarization layer are removed from the adhesion area.

13. The method of claim 1, wherein the voltage line comprises a first voltage line and a second voltage line which apply different voltages from each other,
the first voltage line comprises a first main voltage line formed between the display area and the pad area to correspond to a first edge of the display area, and a first connection unit extending from the first main voltage line to the pad area,
the second voltage line comprises a second main voltage line which surrounds a remaining edge of the display area other than the first edge, and a second connection unit extending from the second main voltage line to the pad area, and
respective portions of the first connection unit and the second connection unit which are between the pad area and the display area are exposed.

14. The method of claim 1, wherein the voltage line is a three-layered layer including a first metal layer, a second metal layer, and a third metal layer, and an etch rate of the second metal layer is greater than an etch rate of each of the first metal layer and the third metal layer.

* * * * *